United States Patent [19]

Haferl

[11] 4,223,251
[45] Sep. 16, 1980

[54] DEFLECTION CIRCUIT WITH RETRACE CONTROL

[75] Inventor: Peter E. Haferl, Adliswil, Switzerland

[73] Assignee: RCA Corporation, New York, N.Y.

[21] Appl. No.: 42,593

[22] Filed: May 24, 1979

[51] Int. Cl.² ............................................. H01J 29/70
[52] U.S. Cl. .................................. 315/370; 315/371; 315/408
[58] Field of Search ....................... 315/370, 371, 408

[56] References Cited

U.S. PATENT DOCUMENTS 3,962,602  6/1976  Dietz ...................................... 315/370
4,034,263  7/1977  Dietz ...................................... 315/408

Primary Examiner—Malcolm F. Hubler
Attorney, Agent, or Firm—Eugene M. Whitacre; Paul J. Rasmussen; Joseph J. Laks

[57] ABSTRACT

A horizontal deflection winding forms a resonant retrace circuit with two series coupled retrace capacitors during a retrace interval. A controllable circuit in shunt with the second capacitor bypasses a controlled amount of retrace current from that capacitor thereby controlling the retrace pulse width. East-west raster correction, width control and pulse amplitude control are possible depending on the variables selected for control.

11 Claims, 5 Drawing Figures

DEFLECTION CIRCUIT WITH RETRACE CONTROL

BACKGROUND OF THE INVENTION

This invention relates to deflection circuits for television receivers, for example.

Many regulated power supplies for television receivers provide AC line mains isolation by developing the supply voltages for the television receiver circuits from the voltages developed across windings of the horizontal output or flyback transformer. In these systems all the required power flows through the windings, with the power transfer synchronized with horizontal deflection. The unregulated voltage source is coupled to the flyback transformer primary winding. The regulated quantity is usually either the B+ supply voltage or the horizontal retrace pulse amplitude.

Horizontal deflection circuits typically operate in a resonant oscillatory mode. During trace, an approximately half-wave oscillation occurs between a horizontal deflection winding and an "S" shaping trace capacitor, and during retrace a half-wave oscillation occurs between the deflection winding and retrace capacitor. Also, during retrace a winding of the flyback transformer is coupled across the retrace capacitor to compensate for the power losses in the horizontal deflection circuit. Thus the flyback transformer is part of the horizontal retrace circuit. Any power or load variations at the flyback transformer influences the horizontal retrace time and results in picture width variations. Further, all the voltages derived from trace rectification, not just the voltage coupled to the varying load, vary at the same time. Loading of one trace rectified voltage terminal affects all the trace rectified voltages.

Loading of the flyback transformer also changes the duty cycle and consequently also the secondary voltages because the control circuit of the power supply typically affects either the retrace or trace voltage amplitude but not both simultaneously. Modulating the east-west raster correction by the sum of all load variations in order to obtain a constant, undisturbed picture as described in U.S. Pat. No. 4,129,806 by P. E. Haferl, may not be a complete solution because the trace derived secondary voltages of the flyback transformer are not compensated. Large load variations, caused by operation of a 10 watt audio amplifier circuit, for example, can no longer be compensated by the east-west raster correction circuit.

SUMMARY OF THE INVENTION

A deflection winding forms a resonant retrace circuit with a retrace capacitor network during a retrace interval. A circuit in shunt with at least a portion of the network bypasses a controllable amount of retrace current from the capacitor network in order to control a selected deflection circuit quantity.

DESCRIPTION OF THE INVENTION

Figure 1:
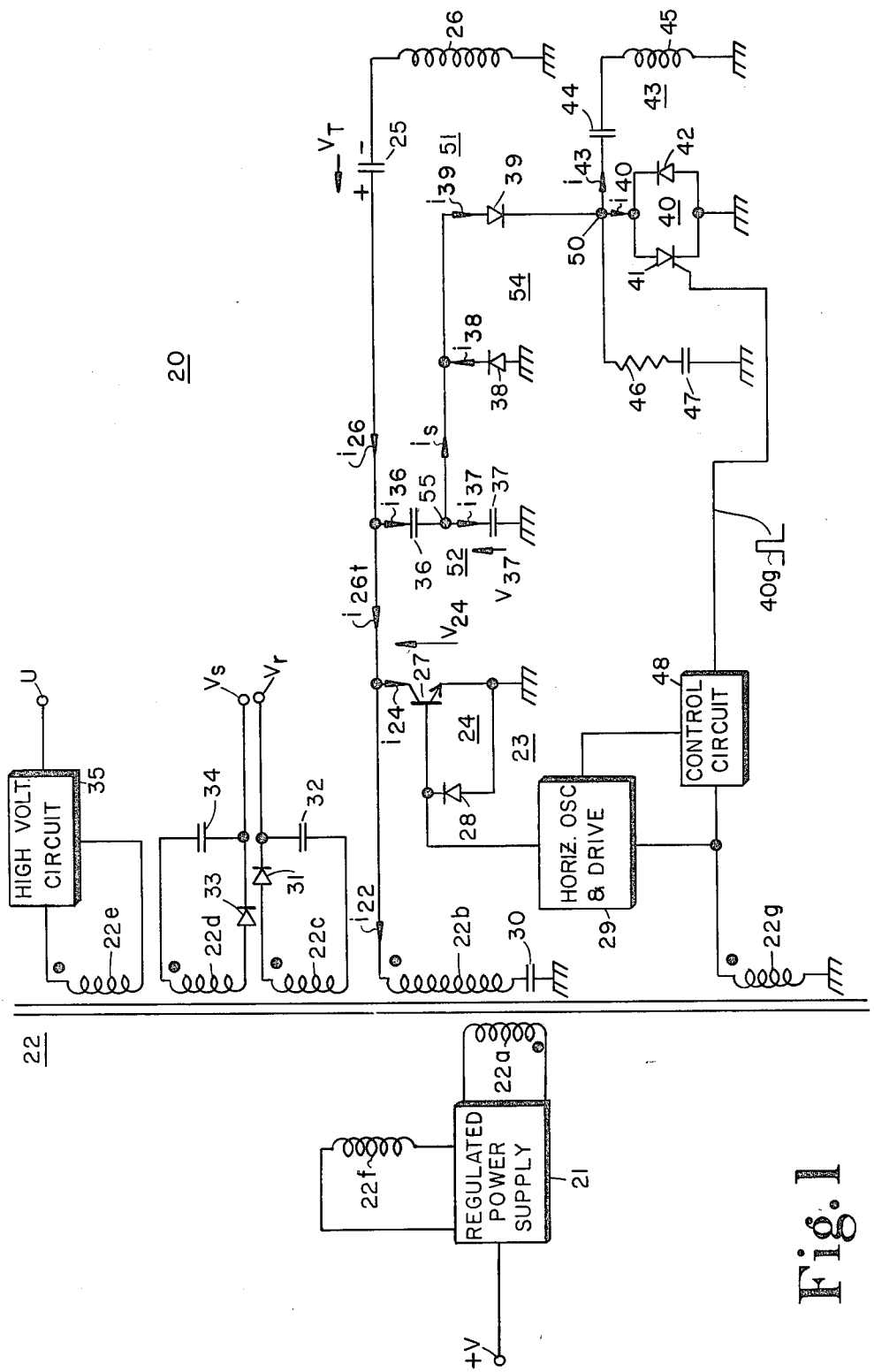
FIG. 1 illustrates a horizontal deflection circuit including retrace pulse control, embodying the invention.

FIG. 1 illustrates a regulated horizontal deflection circuit 20 with retrace pulse control, embodying the invention. An unregulated voltage +V is coupled to a regulator power supply circuit 21. Pulses of energy synchronized with horizontal deflection obtained from power supply circuit 21 are coupled through a primary winding 22a of a horizontal output of flyback transformer 22 to various flyback-coupled load circuits. Regulator power supply circuit 21 may be of conventional design or similar to those described in U.S. patent application Ser. No. 964,538 filed Nov. 29, 1978 by P. E. Haferl entitled "Regulated Deflection Circuit" or U.S. patent application Ser. No. 018,361 filed Mar. 7, 1979 by Walter Bohringer entitled "Regulated Deflection System".

Coupled to a flyback secondary winding 22b is a horizontal output stage 23 comprising a trace switch 24 coupled to a series-coupled trace capacitor 25 and horizontal deflection winding 26. Trace switch 24 comprises a horizontal output transistor 27 and a damper diode 28 coupled to the base of transistor 27. A conventional horizontal oscillator and driver circuit 29 couples a horizontal rate square-wave voltage to transistor 27 to turn the transistor on during trace and to turn the transistor off to initiate horizontal retrace. A direct current blocking capacitor 30 is coupled to secondary winding 22b.

The retrace pulse portion of the voltage developed across a flyback secondary winding 22c is rectified by a diode 31 and filtered by a capacitor 32 to provide a supply voltage $V_r$ for such load circuits as the audio and horizontal oscillator. The trace voltage portion of the voltage developed across a flyback secondary winding 22d is rectified by a diode 33 and filtered by a capacitor 34 to provide a supply voltage $V_s$ for such load circuits as vertical deflection and video stages. A high voltage flyback winding 22e is coupled to a high voltage circuit 35 for providing an ultor accelerating potential at a terminal U.

As illustrated in FIGS. 2a and 2b, during the horizontal trace interval, prior to time $t_2$ and also after time $t_6$, the horizontal deflection current $i_{26}$ flows as a sawtooth trace current $i_{26t}$ toward trace switch 24. Near time $t_2$ trace switch 24 open-circuits. Horizontal deflection winding 26 forms a resonant retrace circuit 51 with a retrace capacitance network 52. Retrace capacitance network 52 comprises, in part, series coupled capacitors 36 and 37. The deflection current $i_{26}$ during the resonant retrace interval $t_2$–$t_6$ flows in retrace capacitor 36 as a retrace deflection current $i_{36}$. A retrace pulse voltage $V_{51}$ of peak amplitude $V_p$ is developed across trace switch 24, at the collector of horizontal output transistor 27.

The retrace frequency, $\frac{1}{2}T_R$, where $T_R$ is the retrace interval duration, of resonant retrace circuit 51 is determined, in part, by the effective retrace capacitance coupled to deflection winding 26. If retrace capacitor 37 is in series with retrace capacitor 36 for the entirety of the retrace interval, the retrace interval is thereby shortened. If retrace capacitor 37 is prevented from storing retrace current or charge, as for example, by short-circuiting the capacitor to ground for the entirety of the retrace interval, then the retrace interval duration is increased to a maximum value.

Controlling the retrace interval duration or the retrace pulse $V_{51}$ width also enables many quantities or parameters associated with regulated deflection circuit 20 to be controlled. For example, the DC trace voltage $V_T$ across trace capacitor 25 equals the DC or average value of the voltage $V_{24}$ across trace switch 24, as illustrated by the dashed line 53 of FIG. 2. The deflection current amplitude $I_{pp}$ is a function in part of the trace voltage $V_T$. Increasing the retrace pulse duration, while maintaining the peak retrace pulse voltage $V_p$ as the regulated constant quantity, increases $V_T$ and thus increases the deflection current amplitude.

The voltage across secondary winding 22b is of similar waveshape as waveform $V_{24}$ of FIG. 2a but has an AC-zero level coinciding with the lie 53. That is, with the undotted terminal of winding 22b as the reference terminal, a negative trace voltage $-V_T$ is developed across the winding during trace and a positive retrace voltage $V_R$ is developed during retrace, with $V_T + V_R = V_p$. A current $i_{22}$ flows in winding 22b. Retrace pulse duration or width modulation modulates both the trace voltage $V_T$ and retrace voltage $V_R$, with the area of waveform $V_{24}$ under line 53 equaling the area over line 53, because no net or DC voltage can be sustained across an inductor or transformer winding.

Modulation of the trace and retrace voltages results in modulation of the respective trace and retrace-rectified supplies $V_s$ and $V_r$ as well as the ultor voltage at terminal U.

If the quantity that is to be regulated is the trace voltage $V_T$, for example, any retrace pulse duration modulation will then modulate the pulse amplitude $V_p$ and the retrace voltage $V_R$ across a flyback transformer winding. The deflection current amplitude should not vary substantially other than the relatively small variations due to the increase or decrease in trace time, during which trace time the trace voltage $V_T$ is coupled across deflection winding 26 by action of trace switch 24.

To control the retrace interval duration, the effective capacitance associated with capacitance network 52 is controllably varied. A retrace current shunt circuit 54 is coupled across retrace capacitor 37. Current shunt circuit 54 comprises diodes 38 and 39, and a controllable bidirectionally conductive switch 40 comprising an ITR, or SCR 41 and a parallel oppositely-poled diode 42. The cathode of diode 38 and the anode of diode 39 are coupled to a terminal 55, the junction of retrace capacitors 36 and 37. The anode of SCR 41 is coupled at a terminal 50 to the cathode of diode 39. Coupled across switch 40 is a resonant commutating circuit 43 comprising a capacitor 44 and an inductor 45. A snubber network comprising a resistor 46 and capacitor 47 is coupled across switch 40.

The retrace current $i_{36}$ flowing through retrace capacitor 36 and into terminal 55 divides into two currents, a retrace current $i_{37}$ flowing through retrace capacitor 37 and a retrace shunt or bypass current $i_s$ flowing into retrace shunt circuit 54. Because retrace currents $i_{36}$ and $i_{37}$ flow through capacitors 36 and 37, respectively, these currents are AC currents only; that is, they contain no DC component. Shunt current $i_s$ is, therefore, also only an AC current. The positive portion $i_{39}$ of shunt current $i_s$ can flow only through a first shunt path, diode 39, whereas the negative portion $i_{38}$ can flow only through a second shunt path, diode 38. The total charge (ampere-second) shunted away from retrace capacitor 37 by positive current $i_{39}$ flowing in diode 39 must therefore equal the total charge returned to terminal 55 by negative current $i_{38}$ flowing in diode 38.

The positive current $i_{39}$ flowing through diode 39 into terminal 50 divides into two currents, a commutating current $i_{43}$ flowing through capacitor 44 and inductor 45, and a switch current $i_{40}$ flowing through switch 40. Commutating current $i_{43}$ is also only an AC current. Thus, the DC component $I_{DC}$ of current $i_{39}$ flowing in diode 39 must flow through switch 40 as the same DC current component $I_{DC}$ of the switch current $i_{40}$.

The retrace pulse duration may be controlled by controlling the effective capacitance of retrace capacitor 37 by means of current shunt circuit 54. Shunting greater amounts of current $i_s$, that is, shunting a greater quantity of charge, from retrace capacitor 37 results in an apparent increase in the capacitance of retrace capacitor 37, and thus an increase in the effective capacitance associated with resonant retrace circuit 51 and thus an increase in the retrace pulse width. The greatest retrace pulse width will occur when all of the retrace current is shunted away from retrace capacitor 37, resulting in a maximum retrace capacitance; that is, retrace capacitor 37 will appear as a short-circuit.

The amount of charge shunted away from retrace capacitor 37 is controlled by controlling the DC current component $I_{DC}$ flowing through switch 40. A gate control circuit 48 provides a variably phase delayed gating signal 40g SCR 41 within each horizontal trace interval. During the initial turn-on period after deflection circuit 20 energization, the uncharged commutating capacitor 44 is charged through diode 39 to the peak retrace voltage developed across retrace capacitor 37. In this initial interval, diode 39 thus functions as a peak detector or rectifier.

The resonant frequency of commutating circuit 43 is selected to approximately equal the horizontal retrace frequency $\frac{1}{2}T_R$. Consider a gating pulse 40g from control circuit 48 turning on switch 40 at a time prior to time $t_0$ of FIGS. 2e and 2f, where the interval $t_0-t_2$ equals $2T_R$ or twice the retrace interval. Although not illustrated in FIGS. 2e and 2f, a full-cycle of resonant current oscillation of commutating current $i_{43}$ occurs entirely within the trace interval. ITR or switch 40 is commutated-off by current $i_{43}$, or becomes nonconductive, prior to time $t_2$, the beginning of retrace. Capacitor 44 is recharged substantially to its peak value after the oscillation is stopped, disregarding resistive losses that have occurred.

During retrace, no shunt current will flow as neither diode 38 nor diode 39 will be forward biased. All the retrace deflection current $i_{36}$ flows into retrace capacitor 37 as retrace current $i_{37}$. Retrace capacitor 37 is part of the resonant retrace circuit for the entirety of the retrace interval and the retrace capacitance of network 52 is at a minimum as is the retrace pulse width.

Consider now control circuit 48 gating switch 40 into conduction at a time $t_1$, after time $t_0$, as illustrated in FIG. 2e. Commutating current $i_{43}$ will not complete one full cycle of oscillation before the beginning of retrace at time $t_2$. Near time $t_2$, trace switch 24 is turned off and a retrace current $i_{36}$ begins to flow into terminal 55. Terminal 55 is nearly at ground potential as both diode 39 and switch 40 will be conducting the shunt current $i_s$. Shortly after time $t_2$, sufficient positive shunt current $i_{39}$ is flowing into terminal 50, to exceed the negative switch current $i_{40}$ flowing from switch 40. Switch 40 commutates-off or becomes nonconductive slightly after time $t_2$. Positive shunt current $i_{39}$ then flows as the commutating current $i_{43}$, as illustrated in FIGS. 2d, 2e and 2f, with current $i_{39}$ equaling current $i_{43}$ after time $t_2$. Positive shunt current $i_{39}$ recharges capacitor 44 of commutating circuit 43 to a peak voltage $V_{43}$, near time $t_4$, as illustrated in FIGS. 2d and 2f and as illustrated in FIG. 2h by the shunt switch voltage $V_{40}$. At some time after $t_2$, the switch voltage substantially equals the voltage level $V_{43}$.

The retrace deflection current $i_{37}$ flowing through retrace capacitor 37 equals the retrace deflection current $i_{36}$ flowing into terminal 55, less the shunt current $i_s$. Thus, as illustrated in FIGS. 2c and 2d, current $i_{37}$ equals a positive current component $i_{37p}$ through approximately time $t_4$, the center of retrace when deflection current $i_{26}$ reverses direction. Current $i_{37}$ charges retrace capacitor 37 to a peak voltage $V_1$ at time $t_4$, as illustrated in FIG. 2g, by the voltage $V_{37}$ across capacitor 37. Retrace deflection current $i_{37}$ equals a negative current component $i_{37n}$ between times $t_4$-$t_5$.

At time $t_5$, retrace capacitor 37 is completely discharged, as illustrated in FIG. 2g, and voltage $V_{37}$ attempts to reverse polarity. Diode 38 becomes forward biased and short-circuits retrace capacitor 37, stopping the retrace current $i_{37}$ flow. Shunt current $i_s$ resumes as a current $-i_{38}$, as illustrated in FIG. 2d, and completes the discharge of retrace capacitor 36. At time $t_6$, retrace pulse $V_{51}$ equals zero, and damper diode 28 of trace switch 24 begins to conduct a trace current $i_{24}$ during the next trace interval.

Because switch 40 turn-on is phase-delayed until time $t_1$, the commutating current $i_{43}$, flowing through switch 40 as switch current $i_{40}$, is prevented from completing one full cycle of oscillation. Commutating capacitor 44 is prevented from recharging through the switch to its original voltage $V_{43}$ that the capacitor had assumed prior to time $t_1$, the beginning of commutating current oscillation. One notes that the average value of switch current $i_{40}$ is not-zero but a DC component value $I_{DC}$ representing the discharge of capacitor 44 through switch 40, as illustrated in FIG. 2e.

With shunt switch 40 nonconductive during retrace, the positive recharging current for capacitor 44 is provided by the positive shunt current $i_{39}$. Current $i_{39}$ must therefore also have an average or DC value of $I_{DC}$, as illustrated in FIG. 2d. As the total shunt current $i_s$ can have no DC component, as explained previously, the negative shunt current $-i_{38}$ must have the same DC component magnitude, namely, the value $-I_{DC}$. That is to say, the total charge $q_p$, the shaded area under $i_{39}$, that is shunted away from retrace capacitor 37, must equal the total charge $q_n$ returned to terminal 55 by the negative current $-i_{38}$.

By controlling the degree to which switch 40 leaves commutating capacitor 44 discharged, at the beginning of retrace, as represented by the DC current component of switch current $i_{40}$, the amount of charge which is shunted away from retrace capacitor 37 is thereby also controlled. Shunting greater amounts of charge from retrace capacitor 37, by increasingly phase delaying within trace the switch 40 turn-on instant, results in an apparent or effective increase in the capacitance of retrace capacitor 37, thereby resulting in an increase in the retrace pulse $V_{51}$ duration, assuming the pulse height or peak voltage $V_p$ is maintained constant. thus, retrace pulse $V_{51}$ is a wider pulse when switch 40 is turned on at time $t_1$ than it is when switch 40 is turned on prior to time $t_0$ and no shunt current $i_s$ flows at all. The retrace pulse amplitude $V_p$ may be maintained constant by feeding back to regulator power supply 21 of FIG. 1 the voltage developed across a flyback transformer winding 22f.

Figure 2:
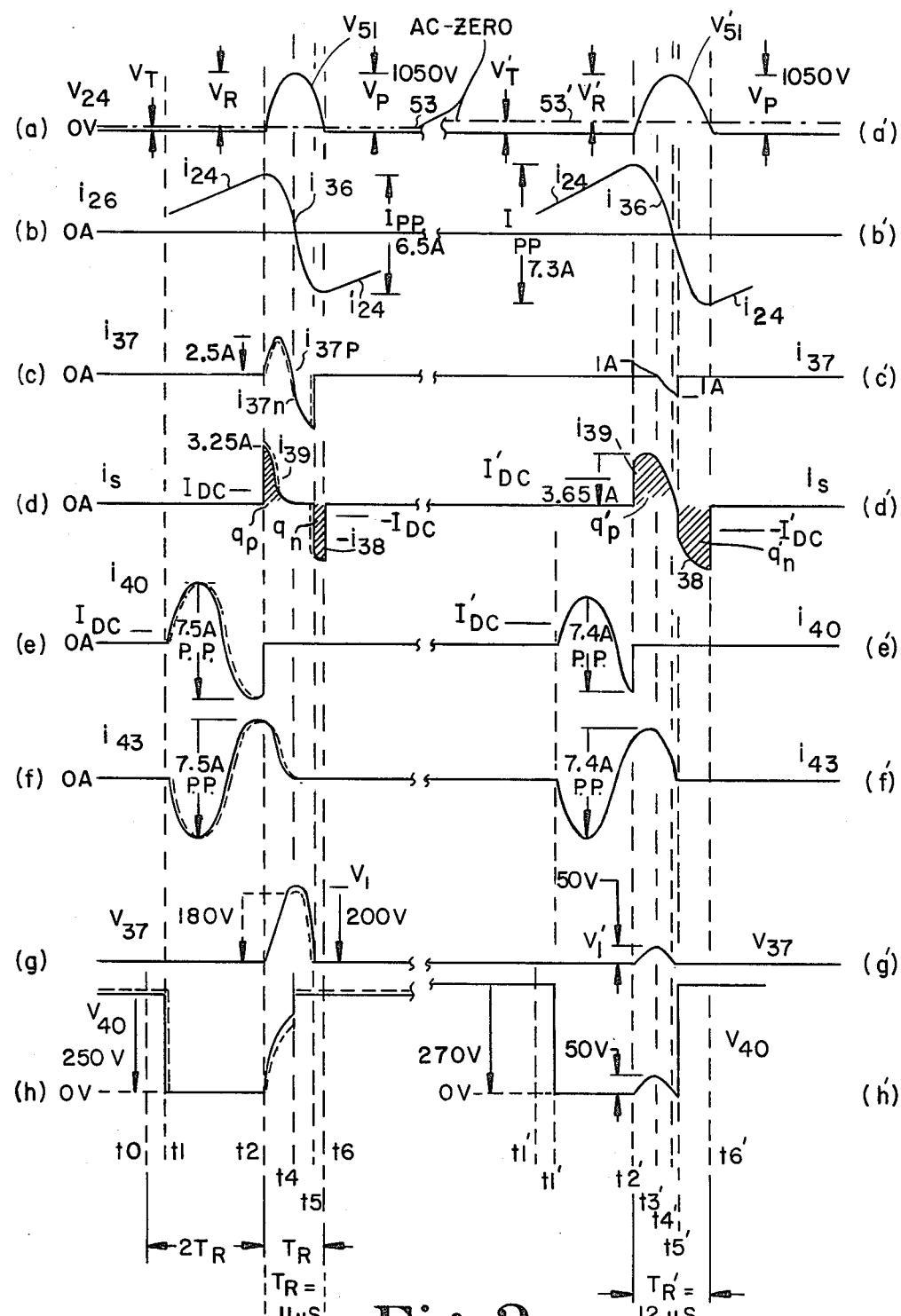
FIG. 2 illustrates waveforms associated with the circuit of FIG. 1.

To further increase the retrace pulse width, the turn-on instant of shunt switch 40 is phase-delayed until an instant $t_1'$, even later than the aforementioned instant $t_1$. The right-side waveforms of FIG. 2, waveforms 2a'-2h', apply in this situation. Commutating current $i_{43}$ is permitted to complete even less of a full cycle of oscillation before retrace begins at time $t_2'$ than it had completed for the previously described situation, as illustrated by FIGS. 2e' and 2f'. Commutating capacitor 44 is discharged more than for the previous situation, with capacitor 44 even assuming a negative polarity voltage.

A recharging DC current component $I_{DC}'$ is now required to positively recharge commutating capacitor 44 to the peak voltage $V_{43}'$ it had assumed prior to the beginning of retrace, as illustrated in FIGS. 2e' and 2h'. Because of the increase in phase delay of the switch 40 turn-on to the instant $t_1'$, the DC current component $I_{DC}'$ of right-side FIG. 2e' is larger than the DC current component $I_{DC}$ of left-side FIG. 2e. The positive shunt current $i_{39}$ required to recharge capacitor 44 is greater, as indicated in FIG. 2d'. Thus, the positive charge $q_p'$ shunted away from retrace capacitor 37 is also greater, as is also greater the negative charge $q_n'$ shunted away from capacitor 37, as a negative current $i_{38}$ flowing into retrace capacitor 36 at terminal 55 from the diode 38.

Because the shunt current $i_s$ is of a greater quantity, the retrace deflection current $i_{37}$ is therefore of a lesser quantity, as illustrated in FIG. 2c'. The peak retrace voltage $V_1'$ developed across retrace capacitor is less, as illustrated in FIG. 2g'. The peak retrace voltage $V_1'$ is reached at an earlier instant $t_3'$ when retrace current $i_{37}$ reverses prior to the center of trace at time $t_4'$, as illustrated in FIGS. 2c' and 2g'. Diode 38 begins conducting at the instant $t_5'$ when the voltage across retrace capacitor 37 reaches zero, as illustrated in FIGS. 2c', 2d' and 2g'. Resonant retrace ends at time $t_6'$, as illustrated by the pulse voltage $V_{51}'$.

Because greater amounts of both positive charge $q_p'$ and negative charge $q_n'$ are shunted away from retrace capacitor 37, the apparent or effective retrace capacitance coupled to deflection winding 26 increases, thereby increasing the retrace pulse width from $T_R$, the interval $t_2$-$t_6$ of FIG. 2a to $T_R'$, the interval $t_2'$-$t_6'$ of FIG. 2a'. Alternatively explained, because the voltage $V_{37}$ across retrace capacitor 37 aids in rapidly reversing the retrace deflection current $i_{36}$, shunting more current from capacitor 37 decreases the voltage developed across the capacitor, causing a less rapid reversal of current and a wider retrace pulse.

The regulator power supply 21 controls one quantity, either $V_p$ or $V_R$, for example. By controlling the turn-on instant of shunt switch 40, the retrace pulse width may be independently controlled, thereby controlling another quantity, the trace voltage $V_T$, for example. Further, by controlling pulse width, other parameters may also be controlled. For example, when retrace pulse $V_{51}'$ is maintained at a constant amplitude $V_p$ by regulator power supply 21, increasing the pulse width increases the trace voltage across trace capacitor 25 to $V_T'$, as illustrated by the line 53' of FIG. 2a'. An increased trace voltage results in an increased peak-topeak deflection current $i_{26}$ relative to that of $I_{pp}'$, as illustrated in FIGS. 2a' and 2b'. Thus, for example, picture width can be controlled by controlling the retrace pulse duration, by controlling the conduction of shunt switch 40. Varying the turn-on instant of SCR 41 at a vertical parabolic rate will also vary the peak-to-peak deflection current $I_{pp}$ in a vertical parabolic manner thereby providing east-west raster correction.

Load circuit modulation of the retrace pulse width may be compensated. For example, increased audio loading of the supply voltage $V_r$ and of second winding 22c from zero watts to 10 watts is partially reflected across winding 22b and results in an increased current $i_{22}$ in winding 22d, the winding being in shunt with deflection winding 26, resulting in a narrower retrace pulse. Control circuit 48 senses the decrease in pulse width, as will be described later, and phase delays the turn-on instant of control switch 40 beyond time $t_1$ to maintain a constant width for retrace pulse $V_{51}$ and a constant deflection current $i_{26}$, as illustrated by the dashed waveforms of the left-side FIGS. 2a–2h.

The controllable shunt switch 40 functions as a controlled current sink for controlling the amount of the positive current $i_{39}$ and charge $q_p$ shunted away from retrace capacitor 37. ITR switch 40 may thus be replaced by a transistor or SCR, for example, with the conduction angle of the transistor of SCR varied within trace, thereby shunting varied amounts of charge from retrace capacitor 37. The function of diode 42 will now be performed by diodes 38 and 39.

Figure 3:
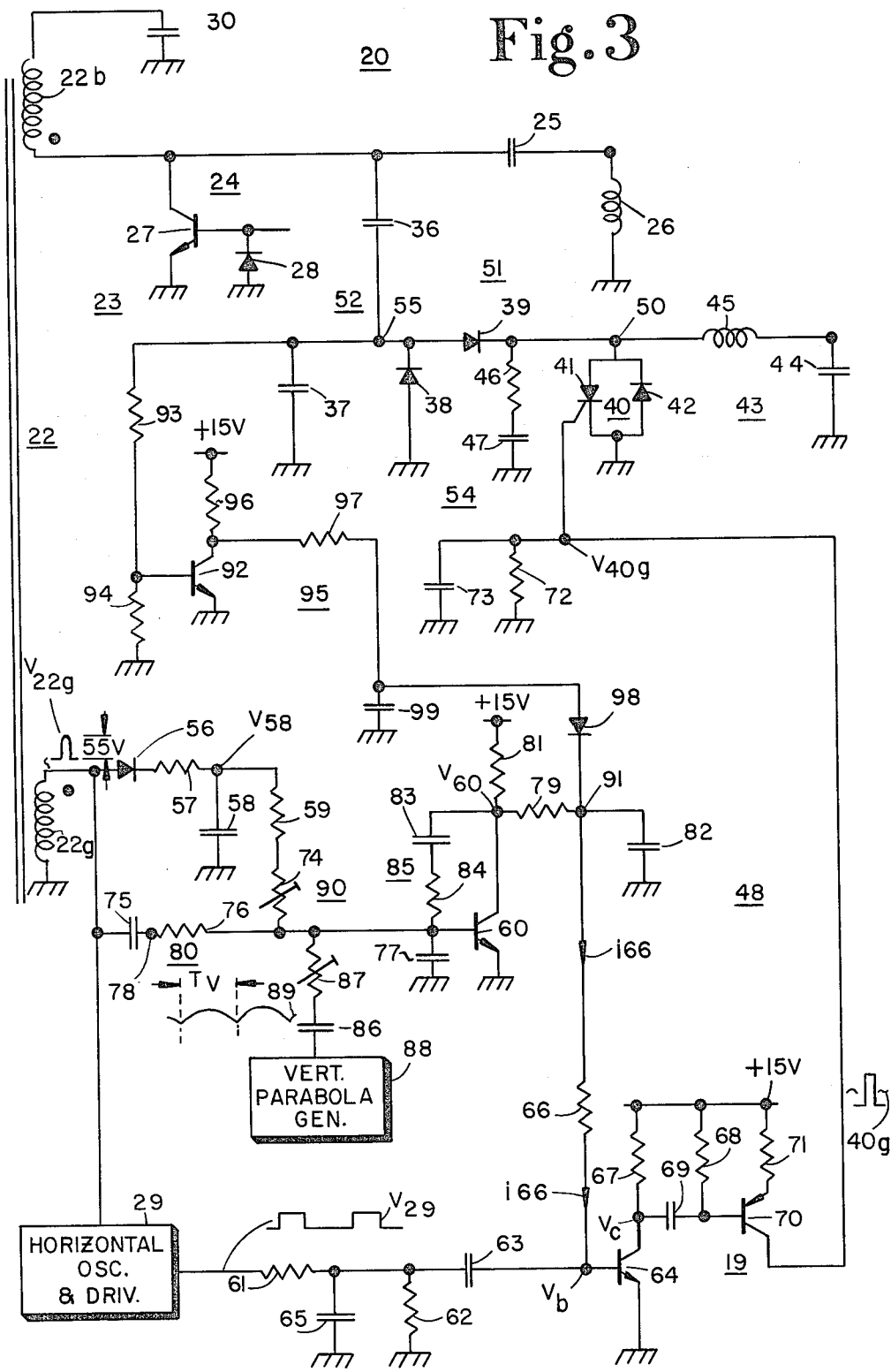
FIG. 3 illustrates portions of the circuit of FIG. 1, including a detailed embodiment of a gate control circuit.

An embodiment of gate control circuit 48 is illustrated in FIG. 3. A horizontal square-wave voltage $V_{29}$, illustrated in FIG. 4a, obtained from horizontal oscillator and driver 29, is voltage divided by resistors 61 and 62 and AC coupled through a capacitor 63 to the base of a transistor 64 of a boxcar gate pulse forming network 19. A capacitor 65 is coupled across resistor 62. Square-wave voltage $V_{29}$ is also coupled, after being inverted, to the base of horizontal output transistor 27 of trace switch 24, the coupling not being illustrated in FIG. 3.

The upper voltage level of $V_{29}$ extends from time $T_1$, just prior to the beginning of retrace, until time $T_4$, just after the beginning of trace, with horizontal retrace occurring between times $T_2$–$T_3$. The lower voltage level of $V_{29}$ extends from time $T_4$ until time $T_6$, entirely within the trace interval $T_3$–$T_7$.

Figure 4:
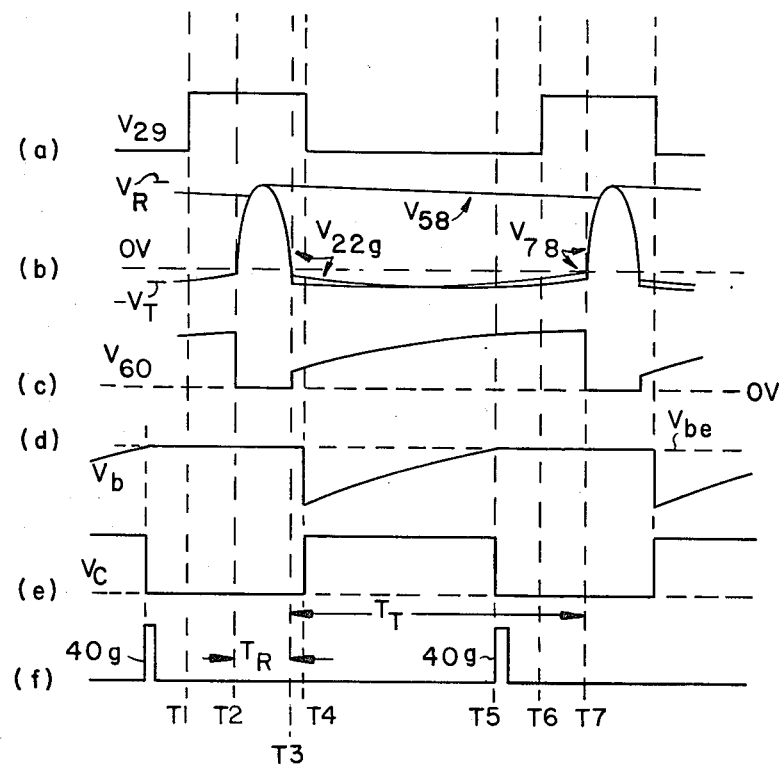
FIG. 4 illustrates waveforms associated with the circuit of FIG. 3.

At time $T_4$, voltage $V_{29}$ switches to its lower level, reverse biasing transistor 64, as illustrated in FIG. 4d, by the voltage $V_b$ at the base of transistor 64. A charging current $i_{66}$, of controlled magnitude, flowing in a charging resistor 66 from a charge current input terminal 91, charges capacitor 63. The voltage $V_b$ begins to increase. At a controlled instant within trace, at time $T_5$, $V_b$ reaches the threshold level $V_{be}$ and switches on transistor 64, as illustrated in FIG. 4d and in FIG. 4e by the collector voltage $V_c$ of transistor 64.

A differentiating network comprising resistors 67 and 68 and a capacitor 69 differentiates the trailing edge of voltage $V_c$ to produce a negative pulse at the base of a transistor 70, at time $T_5$. A pulse voltage 40g at the collector of transistor 70 is developed beginning at time $T_5$, as illustrated in FIG. 4f. Pulse 40g is coupled to the gate of SCR 41 of shunt switch 40 and turns switch 40 on at time $T_5$ to begin the current oscillation within resonant commutating circuit 43, as previously described. A resistor 71 couples the emitter of transistor 70 to a +15 volt supply, and a gate pulse waveshaping circuit, comprising a resistor 72 and a capacitor 73, is coupled to the gate of SCR 41.

A width modulation control circuit 90 controls the charging current $i_{66}$ through resistor 66 thereby controlling the turn-on instants of transistors 64 and 70 and thus of shunt switch 40. A retrace pulse portion of the voltage $V_{22g}$, developed across flyback secondary winding 22g of width modulation control circuit 90, is peak rectified by a diode 56, a current limiting resistor 57 and a capacitor 58, as illustrated in FIG. 4b both by the voltage $V_{22g}$ and the voltage $V_{58}$ across capacitor 58. Capacitor 58 discharges slightly during the trace interval, the discharge path including a resistor 59, a potentiometer 74, and the base-emitter diode of a transistor 60. Thus a component of the voltage at the base of transistor 60 is a voltage representative of the retrace pulse amplitude $V_R$ of the voltage $V_{22g}$ of FIG. 4b.

Flyback winding voltage $V_{22g}$ is also coupled to an integrating network 80 comprising a capacitor 75 and a resistor 76. A capacitor 77 is coupled across the base and emitter electrodes of transistor 60. During retrace, capacitor 75 charges through winding 22g, resistor 76, and the base-emitter diode of transistor 60. During trace, the discharge path of capacitor 75 includes winding 22g, resistors 76, 74 and 59, and capacitor 58. The integrated voltage, $V_{78}$, at a terminal 78, the junction of capacitor 75 and resistor 76 is illustrated in FIG. 4b.

The time integrated retrace portion of the flyback voltage $V_{22g}$ is a function of retrace amplitude $V_R$ and pulse width duration, $T_R$. The time integrated trace portion of the flyback voltage $V_{22g}$ is a function of the trace amplitude $-V_T$ and the trace duration $T_T$.

Because no net DC voltage is developed across flyback winding 22g, the time integrated retrace voltage must equal the time integrated trace voltage. Thus, the trace integration portion of voltage $V_{78}$ is a measure of the retrace pulse width. An increase in retrace pulse width results in an increase in the trace integration voltage portion of $V_{78}$.

An integrating or smoothing capacitor 82 is coupled to a +15 volt supply through a resistor 79 and a resistor 81. The collector of transistor 60 is coupled to the +15 volt supply through resistor 81. The voltage across capacitor 82 results from the integration of the collector voltage $V_c$ of transistor 60, the collector voltage $V_{60}$ being illustrated in FIG. 4c. The collector voltage $V_{60}$ is a function of the applied voltage at the base of transistor 60, which is the algebraic, proportional sum of the peak rectified retrace voltage $V_{58}$ and the integrated retrace voltage $V_{78}$ of flyback winding voltage $V_{22g}$.

The charging current $i_{66}$ which controls the instant within trace at which the gating pulse 40g is produced varies inversely with the amount of current shunted by transistor 60. A decrease in the retrace pulse width caused by increased audio loading, for example, decreases the magnitude of the negative integrated trace voltage portion of $V_{78}$. Less base current is shunted away from transistor 60 during trace, increasing the shunt conductance of transistor 60 and decreasing the magnitude of charging current $i_{66}$ flowing to the base of transistor 64. A gating pulse 40g is developed later within trace which causes the width of the retrace pulse to increase, as required.

As mentioned previously, capacitors 58 and 75 are charged during retrace. Voltage $V_{58}$ represents the positive peak amplitude of the retrace pulses across winding 22g and voltage $V_{78}$ represents, during trace, the integrated retrace voltage across winding 22g but with negative polarity. During trace, the discharge paths of capacitors 58 and 75 are the same, comprising resistors 59, 74 and 76. Any voltage at the junction of resistors 74 and 76 that is unequal to $V_{be}$ of transistor 60 will drive this transistor either into saturation of into cutoff. To prevent transistor 60 from being driven during trace either into saturation or cutoff by spikes or ringing from transistor 22, a first integration network 85 is coupled between the collector and base electrodes of transistor 60. The integration network 85 comprises a capacitor 83 and resistor 84 with a time constant during trace illustratively of approximately 50 microseconds resulting in the collector waveform of transistor 60 illustrated by FIG. 4c.

As illustrated also by FIG. 4c, transistor 60 is driven into saturation during each retrace period because capacitor 75 charges through resistor 76 and the base-emitter diode of transistor 60. A second integration network comprising resistors 81 and 79 and capacitor 82 further smoothes the voltage $V_{60}$ to the source of current $i_{66}$ at point 91.

The output response of width modulation control circuit 90 is relatively insensitive to amplitude fluctuations of the peak-to-peak value $V_P = V_R + V_T$ of flyback voltage $V_{22g}$. As $V_P$ increases, both $V_R$ and $V_T$ increase in magnitude. The peak rectified retrace pulse voltage $V_{58}$ also increases in magnitude as does the magnitude of the negative integrated trace voltage portion of voltage $V_{78}$. When $V_{58}$ and $V_{78}$ are algebraically summed at the base of transistor 60, these increases cancel. Insensitivity of width modulation control circuit 90 to peak-to-peak flyback voltage amplitude fluctuations is required to prevent pulse amplitude oscillations caused by interactions between regulator power supply 21 and width modulation control circuit 90.

Width modulation control circuit 90 measures the retrace pulse width as the difference between the peak retrace voltage $V_R$ as determined by voltage $V_{58}$ and the integrated retrace voltage, or the equivalent integrated trace voltage, as determined by the voltage $V_{78}$. The resulting error voltage is then compared with ground potential at the base of transistor 60. The time constants associated with capacitors 58 and 75 are selected to be approximately equal in order to obtain a relatively flat or untilted voltage at the base of transistor 60 during much of trace. Capacitor 75 further functions to isolate the relatively low magnitude trace voltage portion of flyback voltage $V_{22g}$ from the base of transistor 60 in order that thermal variations of the base-emitter voltage do not influence the retrace time. The relatively large resistance of resistors 59 and 74 in series enables the resistors to be considered as part of a current source which requires no thermal compensation techniques.

To obtain a predetermined retrace pulse width, the ratio of $R_{59}+R_{74}$ to $R_{76}$ is adjusted. This ratio equals the ratio of $V_R$ to $V_T$, or equivalently, the ratio of $T_T$ to $T_R$. Adjusting variable resistor 74 to obtain a typical ratio of eight results in a retrace pulse width of about 11.6 microseconds.

Variable resistor 74 thus functions as a raster or picture width control. Increasing the resistance of resistor 74 increases the aforementioned ratio, thereby decreasing the retrace pulse width and thus the peak-to-peak deflection current. Compare FIG. 2a, illustrative of a narrow pulse situation, with FIG. 2a', illustrative of a width pulse situation.

By varying the retrace pulse width and thus the peak-to-peak deflection current amplitude in a parabolic manner at a vertical deflection rate of $1/T_v$, where $T_v$ equals the vertical deflection field interval, east-west raster correction may also be provided. To achieve this result, the base voltage at transistor 60 is varied in a parabolic manner at a vertical rate by AC coupling to the base through a capacitor 86 and a resistor 87, a vertical parabolic voltage 89 developed by a conventional vertical parabolic generator 88. The vertical parabolic voltage variation at the base of transistor 60 produces gating pulses 40g which are phase varied in a vertical parabolic manner, as is required for east-west raster correction.

To limit the maximum retrace pulse width obtainable by gate control circuit 48, a range limiter circuit 95 is coupled to charge current input terminal 91. Too wide of a retrace pulse results in too great of an amplitude excursion of the horizontal deflection current resulting in substantially increased dissipation within the horizontal deflection circuit.

Range limiter circuit 95 includes a transistor 92 with the base coupled to retrace capacitor 37 through a resistor 93 of a voltage divider comprising resistor 93 and a resistor 94. A portion of the charge current $i_{66}$ is obtained from a +15 volt supply through a resistor 96, a resistor 97 and a diode 98. A smoothing capacitor 99 is coupled to the junction of resistor 97 and diode 98. The collector of transistor 92 is coupled to the junction of resistors 96 and 97.

An increased retrace pulse width across flyback winding 22b results in a decreased pulse amplitude across retrace capacitor 37, as illustrated by the voltage $V_{37}$ of right-side FIG. 2g'. The conduction of transistor 92 decreases, resulting in an increased current flow from the +15 volt supply through diode 98 into charge current input terminal 91. The charge current $i_{66}$ increases and prevents too great of a phase delayed turn-on of transistor 64, thereby preventing too great of a phase delayed development of gating pulse 40g and thereby limiting the increase in retrace pulse width.

Figure 5:
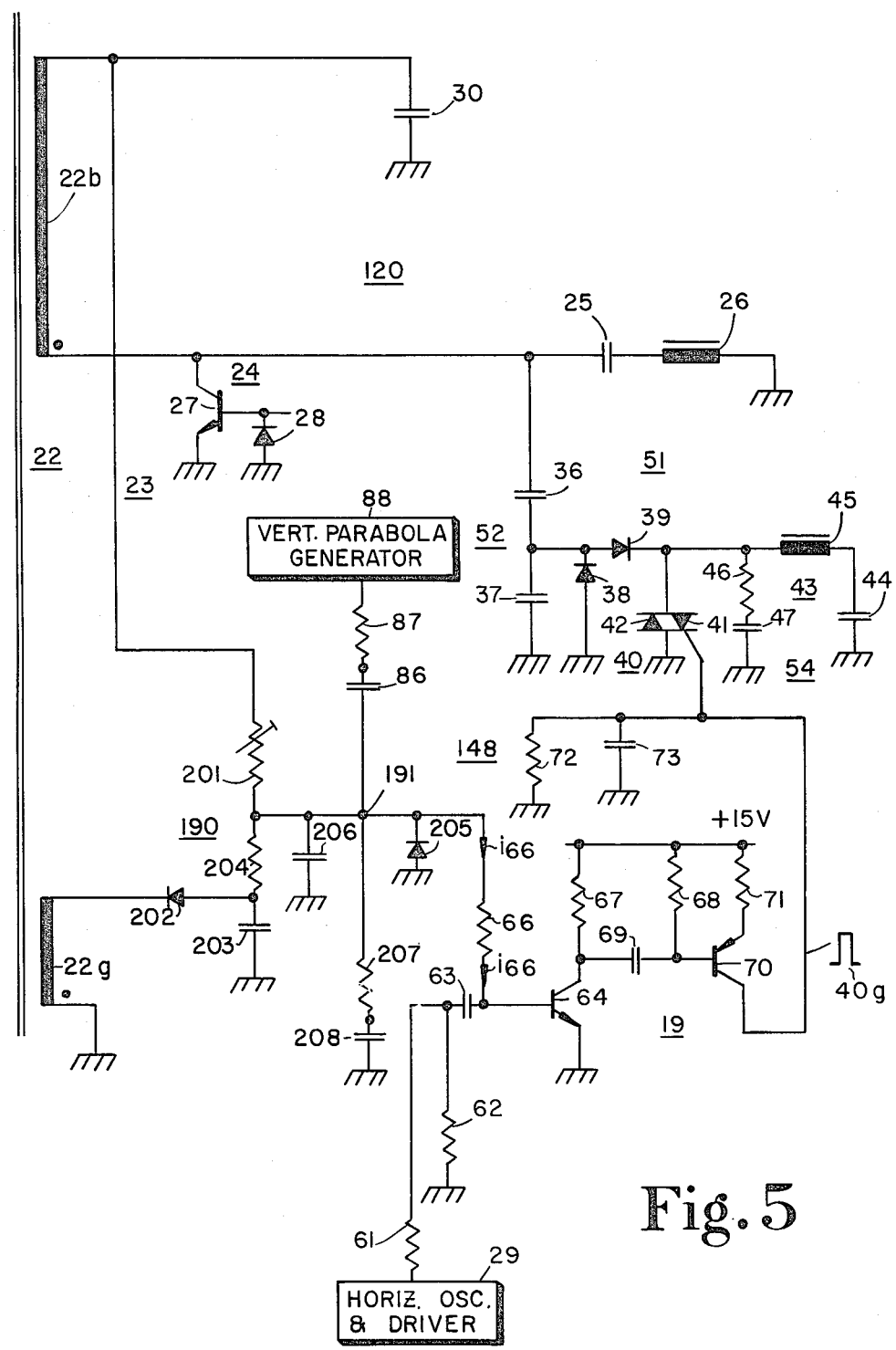
FIG. 5 illustrates portions of the circuit of FIG. 1, including another detailed embodiment of a gate control circuit.

FIG. 5 illustrates a horizontal deflection circuit 120 with another embodiment 148 for a gate control circuit for gating into conduction SCR 41 of retrace current shunt circuit 54. Elements of FIGS. 1, 3 and 5 which function similarly are identically labelled. The charging current $i_{66}$ flowing to the base of transistor 64 of boxcar gate pulse forming network 19 is obtained at a charge current input terminal 191 of a width modulation control circuit 190.

The voltage across capacitor 30 is representative of the trace voltage $V_T$ and is, thus, as previously described, representative of the retrace pulse width. The capacitor 30 voltage is coupled to charge current input terminal 191 through a resistor 201. A decrease in retrace pulse width, for example, results in a decrease in the average voltage across capacitor 30, thereby decreasing the charging current $i_{66}$ flowing to the base of transistor 66, thereby delaying within trace the development of gate pulse 40g, as is required.

To ensure that the output response of width modulation control circuit 190 is relatively insensitive to amplitude fluctuations of the peak-to-peak deflection voltage $V_p$, the retrace voltage across flyback winding 22g is peak detected by a diode 202 and a capacitor 203 and then coupled to charge current input terminal 191 through a resistor 204. A diode 205 eliminates negative voltage excursions at terminal 191. A capacitor 206 provides a high frequency bypass at terminal 191 and a series coupled resistor 207 and capacitor 208 provide additional filtering.

Selected component values for the circuits of FIGS. 1 and 3 are given below:

| | | | | |
|---|---|---|---|---|
| Resistor | 46: | 2200 ohm | Capacitor 25: | 0.68 microfarad |
| | 57: | 3.3 ohm | 30: | 0.47 microfarad |
| | 59: | 8200 ohm | 36: | 0.018 microfarad |
| | 61: | 1000 ohm | 37: | 0.033 microfarad |
| | 62: | 1000 ohm | 44: | 0.047 microfarad |
| | 66: | 22 kilohm | 47: | 2200 picofarad |
| | 67: | 4700 ohm | 58: | 0.047 microfarad |
| | 68: | 4700 0hm | 63: | 2200 picofarad |
| | 71: | 33 ohm | 65: | 220 picofarad |
| | 72: | 100 ohm | 69: | 1000 picofarad |
| | 74: | 4700 ohm | 73: | 4700 picofarad |
| | 76: | 1200 ohm | 75: | 0.22 microfarad |
| | 79: | 4700 ohm | 77: | 4700 picofarad |
| | 81: | 4700 ohm | 82: | 0.47 microfarad |
| | 84: | 1000 ohm | 83: | 4700 picofarad |
| | 87: | 47 kilohm | 86: | 10 microfarad |
| | 93: | 20 kilohm | 99: | 0.47 microfarad |
| | 94: | 1000 ohm | Inductor 45: | 280 microhenry |
| | 96: | 4700 ohm | Deflection | |
| | | | winding 26: | 1.2 millihenry |
| | 97: | 100 ohm | | 1.2 ohm |
| Peak-to-peak voltage of Vertical Parabola | 89: | 10 volts | | |

What is claimed is:

1. A retrace controllable deflection circuit, comprising:
   a deflection winding;
   a source of trace voltage coupled to said deflection winding;
   a trace switch coupled to said deflection winding for generating a trace deflection current in said deflection winding during a trace interval of a deflection cycle;
   a retrace capacitance network coupled to said deflection winding for forming a resonant retrace circuit with said deflection winding during a retrace interval of each deflection cycle, wherein retrace deflection current flows in said network during said retrace interval; and
   controllable shunting means coupled to said retrace capacitance network for bypassing a portion of said retrace deflection current from at least a portion of said network, for controlling the retrace pulse width.

2. A circuit according to claim 1 wherein said retrace capacitance network comprises first and second series coupled retrace capacitors, said controllable shunting means in shunt relationship with said second retrace capacitor.

3. A circuit according to claim 2 wherein said controllable shunting means provides first and second shunt paths for bypassing retrace current from said second retrace capacitor, a controllable switch coupled in said first shunt path controlling the amount of retrace current of a first polarity being bypassed from said second retrace capacitor.

4. A circuit according to claim 3 including control means coupled to said controllable switch and responsive to a first quantity within said deflection circuit to be controlled for varying the conduction of said controllable switch for controlling the retrace pulse width for controlling said first quantity.

5. A circuit according to claim 4 including a resonant circuit capacitively coupled to said controllable switch for controlling the DC current flow through said controllable switch for controlling said first quantity.

6. A circuit according to claim 5 wherein said resonant circuit commutates off said controllable switch.

7. A circuit according to claim 6 wherein said controllable switch comprises an SCR and a parallel oppositely-poled diode.

8. A circuit according to claim 1, 2, 3, 4 or 5 including a regulator power supply coupled to said deflection circuit and responsive to a second quantity other than said first quantity for regulating the energy flow to said deflection circuit.

9. A circuit according to claim 8 wherein said first quantity is representative of said retrace pulse width.

10. A circuit according to claim 9 wherein said first quantity comprises the time-integrated voltage developed across a flyback transformer winding during one of said trace and retrace intervals.

11. A circuit according to claim 9 wherein said first quantity includes a vertical deflection rate component for providing east-west raster width control.

* * * * *